United States Patent
Lu et al.

(10) Patent No.: US 9,590,620 B2
(45) Date of Patent: Mar. 7, 2017

(54) GATE DRIVING CIRCUIT AND DISPLAY PANEL USING THE SAME

(71) Applicant: EverDisplay Optronics (Shanghai) Limited, Shanghai (CN)

(72) Inventors: JiaHao Lu, Shanghai (CN); Xin Mou, Shanghai (CN)

(73) Assignee: EVERDISPLAY OPTRONICS (SHANGHAI) LIMITED, Shanghai (CN)

( * ) Notice: Subject to any disclaimer, the term of this patent is extended or adjusted under 35 U.S.C. 154(b) by 0 days.

(21) Appl. No.: 14/623,167

(22) Filed: Feb. 16, 2015

(65) Prior Publication Data

US 2015/0244361 A1   Aug. 27, 2015

(30) Foreign Application Priority Data

Feb. 27, 2014   (CN) ........................... 2014 1 0070214

(51) Int. Cl.
| | |
|---|---|
| *H03B 1/00* | (2006.01) |
| *H03K 3/00* | (2006.01) |
| *H03K 17/687* | (2006.01) |
| *G09G 3/36* | (2006.01) |
| *G11C 19/28* | (2006.01) |

(52) U.S. Cl.
CPC ......... *H03K 17/687* (2013.01); *G09G 3/3677* (2013.01); *G11C 19/28* (2013.01); *G09G 2310/0264* (2013.01); *G09G 2310/0286* (2013.01)

(58) Field of Classification Search
USPC ....... 32/108–112, 379, 389, 391; 326/22–27, 326/81–87; 327/108–112, 379, 389, 391
See application file for complete search history.

(56) References Cited

U.S. PATENT DOCUMENTS

| | | | | |
|---|---|---|---|---|
| 7,132,875 | B2* | 11/2006 | Nakamura | G11C 5/145 257/E27.062 |
| 7,233,176 | B2* | 6/2007 | Sharma et al. | H03K 19/018585 326/83 |
| 2012/0032944 | A1* | 2/2012 | Kojima | H03F 3/3022 345/212 |
| 2012/0306561 | A1* | 12/2012 | Cao | H03K 19/018521 327/434 |

FOREIGN PATENT DOCUMENTS

| | | |
|---|---|---|
| CN | 1435805 A | 8/2003 |
| CN | 101025638 A | 8/2007 |
| CN | 101388197 A | 3/2009 |
| CN | 102655145 B | 6/2013 |

* cited by examiner

*Primary Examiner* — Brandon S Cole (74) *Attorney, Agent, or Firm* — Andrew F. Young, Esq.; Lackenbach Siegel, LLP (57) ABSTRACT

An embodiment according to the present invention discloses a gate driving circuit and display panel using the same. The circuit includes a driving unit, a control unit, a first negative voltage input, a driving voltage input and a control signal input. Three inputting ends of the driving unit are connected to the different inputs when the status of the driving unit is changed according to the sequence of first cut-off status/first driving status/second driving status/second cutoff status. The benefit of the solution is to prevent circuit invalid due to the drain current generating when the oxide thin film transistor works in the depletion mode.

16 Claims, 7 Drawing Sheets

Figure 13

GATE DRIVING CIRCUIT AND DISPLAY PANEL USING THE SAME

CROSS-REFERENCE TO RELATED APPLICATIONS

The present application claims priority to and the benefit of Chinese Patent Application No. CN 201410070214.6, filed on Feb. 27, 2014, the entire content of which is incorporated herein by reference.

BACKGROUND OF THE INVENTION

1. Field of the Invention

The present disclosure relates to the technology of driving display panels, more specifically, to a gate driving circuit and a display panel using the same.

2. Description of the Related Art

Liquid crystal display devices commonly comprise of display panels and driving circuits. A plurality of display units are arranged on a display panel, which compose a pixel matrix. The driving circuits are applied to liquid crystal display devices, which forms images displayed on display panels.

Thin Film Filed Effect Transistors ("TFT", hereinafter) are frequently used as the basic elements of the driving circuits in display panels. Compared with traditional TFTs with silicon substrates, Oxide Thin Film Transistors ("Oxide TFT", hereinafter) have the characteristics of high mobility and high transmittance and have the advantages of low cost of manufacture and good uniformity. The Oxide TFT LCD using Oxide TFTs has the advantages of swiftly responding, high resolution and low power consumption, which meets the requirement of the display terminal with high definition and high capacity. Hence, Oxide TFTs are considered to be the first choice of the next generation of display panels.

Figure 1:
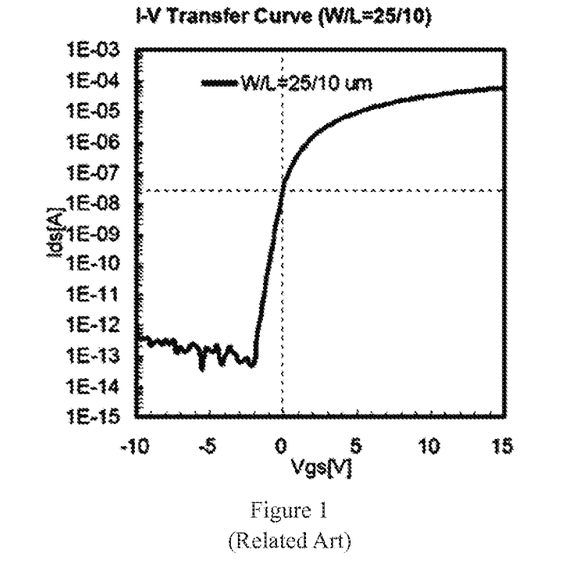
FIG. 1 shows a schematic of the drain current of the Oxide TFT with different voltages on source and gate.
Figure 2:
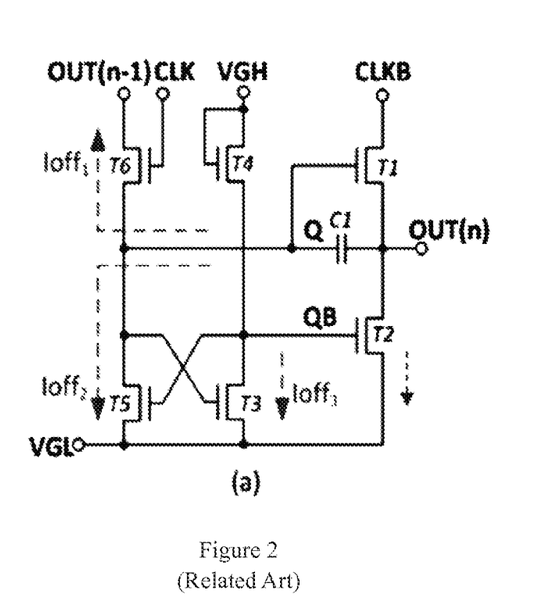
FIG. 2 shows a structure schematic of a gate driving circuit in related art.
Figure 3:
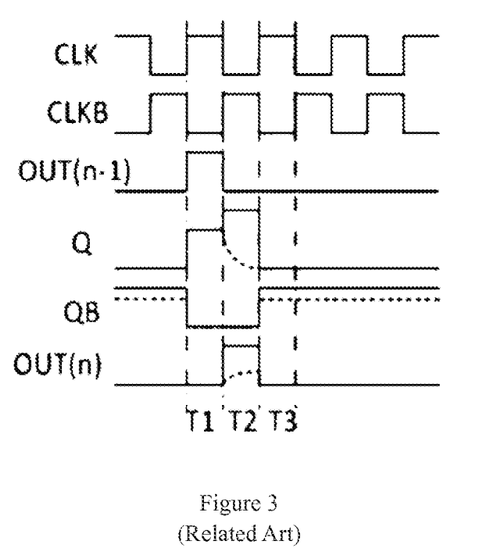
FIG. 3 is a sequence chart of the circuit shown in FIG. 2.

Currently, Oxide TFTs are depletion modes. When the voltage between the gate and the source of a TFT, as shown in FIG. 1, e.g., Vgs=0V, there is a large drain current $I_{ds}$. FIG. 2 is a structure schematic of an gate driving circuit in related art; FIG. 3 is the sequence chart of the driving circuit shown in FIG. 2. Referring to FIGS. 2 and 3, in the driving circuit, drain current Ioff1 will occur on Transistor T6, drain current Ioff2 will occur on Transistor T5, and drain current Ioff3 will occur on Transistor T3. Therefore, the gate driving circuit is failed to output the effect gate driving waveform, which will cause the circuit malfunction. The output of the gate driving circuit connects to the scanning line of the pixel driving circuit to realize the writing control of data signals into the pixel driving circuit. If the gate driving circuit is filed to output the defined gate driving waveform, the data writing of the pixel driving circuit will be influenced.

Figure 4:
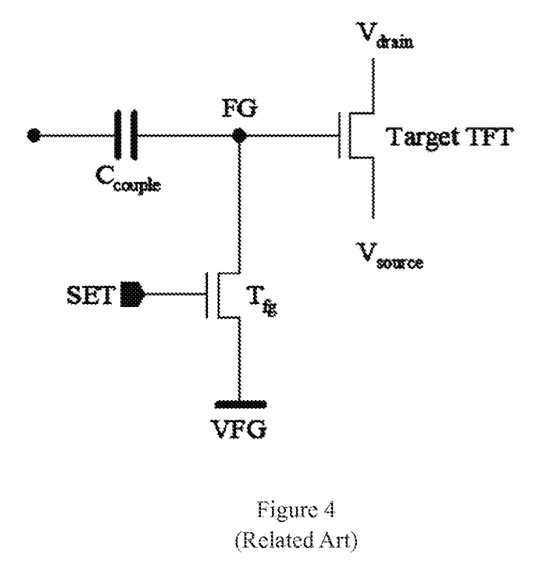
FIG. 4 is a structure schematic of a revised circuit based on the circuit shown in FIG. 2 in the related art.
Figure 5:
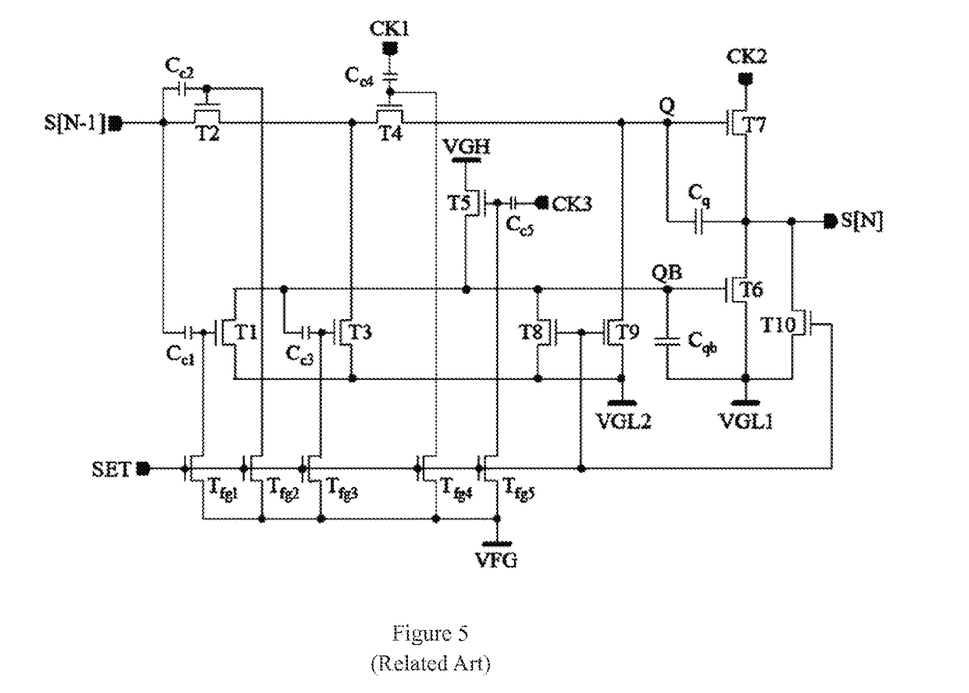
FIG. 5 shows a structure schematic of gate driving circuit using the circuit shown in FIG. 4.

FIG. 4 is a structure schematic of a revised gate driving circuit in related art. As shown in FIG. 4, the repeatedly arranged TFT (Tfg) and capacitor (Ccouple) on each TFT (Target TFT) is used to avoid the circuit malfunction problem caused by the existence of the drain current in TFT device. FIG. 5 is a structure schematic of the GOA (Gate Driver on Array) circuit having the circuit shown in FIG. 4. However, as shown in FIG. 5, it is necessary to add a TFT and a capacitor for each TFT in the original circuit, which will increase TFTs and capacitors. Therefore, the circuit will become more complex and the area occupied by the circuit will increase, which is not beneficial to the design of the narrow frame of display panels and is not beneficial to the cost control.

SUMMARY OF THE INVENTION

An aspect of an embodiment of the present disclosure is directed toward a gate driving circuit capable of avoiding the drain current occurred in circuit devices which may influence the input of the circuit. Another aspect of an embodiment of the present disclosure is directed toward for a display panel using the gate driving circuit.

An embodiment of the present disclosure provides a gate driving circuit comprising:

a control unit controlling the driving circuit to work orderly and recurrently in a first cut-off state, a first driving state, a second driving state and a second cut-off state.

According to one embodiment of the present disclosure, wherein the gate driving circuit further comprises:

a driving unit for driving the gate driving circuit;

a first negative voltage input for defining the voltages output from the driving unit;

a driving voltage input providing voltages to the driving unit; and a control signal input for switching on the driving unit; wherein, when the driving unit works in the first cut-off state, the control unit controls the first negative voltage input to connect to the driving unit;

when the driving unit works in the first driving state, the control unit controls the driving voltage input and the control signal input to connect to the driving unit respectively; and the control unit controls the first negative voltage input to disconnect to the driving unit;

when the driving unit works in the second driving state, the control unit controls the driving voltage input to connect to the driving unit; and the control unit controls the control signal input disconnect to the driving unit;

when the driving unit works in the second cut-off state, the control unit controls the first negative voltage input to connected to the driving unit; and the control unit controls the driving voltage input to disconnect to the driving unit.

According to one embodiment of the present disclosure, wherein the driving unit comprises a driving element and a voltage storage element;

the driving element comprises a control end, a first electrode for inputting driving voltage and a second electrode for outputting voltages; the voltages outputted from the driving element are adjusted according to voltage change on the control end.

According to one embodiment of the present disclosure, wherein the first electrode is a first input end of the driving unit;

a node connecting one end of the voltage storage element with the control end in parallel is a second input end of the driving unit;

a node connecting the other end of the voltage storage element with the second electrode in parallel is a third input end as well as a output end of the driving unit.

According to one embodiment of the present disclosure, wherein the gate driving circuit further comprises a first cut-off unit stopping the driving element outputting voltages;

when the driving unit works in the first cut-off state or the second cut-off state, the first cut-off unit is controlled by the control unit to connect to the second input end;

when the driving unit works in the first driving state or the second driving state, the first cut-off unit is controlled by the control unit to disconnect to the second input end.

According to one embodiment of the present disclosure, wherein the control unit comprises: an NMOS switching transistor connected between the first negative voltage input and the third input end;

when the driving unit works in the first cut-off state or the second cut-off state, the first NMOS switching transistor turns on;

when the driving unit works in the first driving state or second driving state, the first NMOS switching transistor turns off.

According to one embodiment of the present disclosure, wherein the control unit comprises:

a second NMOS switching transistor connected between the first cut-off unit and the second input end;

when the driving unit works in the first cut-off state or the second cut-off state, the second NMOS switching transistor turns on;

when the driving unit works in the first driving state or the second driving state, the second NMOS switching transistor turns off.

According to one embodiment of the present disclosure, wherein the control unit comprises:

a second NMOS switching transistor connected between the first cut-off unit and the second input end;

when the driving unit works in the first cut-off state or the second cut-off state, the second NMOS switching transistor turns on;

when the driving unit works in the first driving state or the second driving state, the second NMOS switching transistor turns off;

the first NMOS switching transistor and the second NMOS switching transistor are connected to a first control level input; the on-off state of the first NMOS switching transistor is identical to that of the second NMOS switching transistor.

According to one embodiment of the present disclosure, wherein the control unit comprises a third NMOS switching transistor connected between the second input end and the control signal input;

when the driving unit works in the first cut-off state, the second driving state or the second cut-off state, the third NMOS switching transistor turns off;

when the driving unit works in the first driving state, the third NMOS switching transistor turns on.

According to one embodiment of the present disclosure, wherein the control unit further comprises:

a fourth NMOS switching transistor connected between the control signal input and the gate of the third NMOS switching transistor; and a second control level input connected to the gate of the fourth NMOS switching transistor;

when the driving unit works in the first cut-off state or the second cut-off state, the second control level input controls the fourth NMOS switching transistor to turn off;

when the driving unit works in the first driving state, the second control level input controls the fourth NMOS switching transistor to turn on.

According to one embodiment of the present disclosure, wherein the control unit further comprises:

a fifth NMOS switching transistor, a third control level input, and a second cut-off unit;

the fifth NMOS switching transistor is connected between the second cut-off unit and the control end of the third NMOS switching transistor; and the third level input is connected to the control end of the fifth NMOS switching transistor;

when the driving unit works in the second driving state, the third control level input controls the fifth NMOS switching transistor to turn on;

when the driving unit works in the first cut-off state, the first driving state or the second cut-off state, the third control level input controls the fifth NMOS switching transistor to turn off.

According to one embodiment of the present disclosure, wherein the first cut-off unit is formed by a second negative voltage input.

According to one embodiment of the present disclosure, wherein the second cut-off unit is formed by a third negative voltage input.

According to one embodiment of the present disclosure, wherein the voltage storage element is formed by a capacitor.

According to one embodiment of the present disclosure, wherein voltage input from the first negative voltage input is $-5V$.

According to one embodiment of the present disclosure, wherein voltage input from the second negative voltage input is $-10V$.

According to one embodiment of the present disclosure, wherein voltage input from the third negative voltage input is $-12V$.

BRIEF DESCRIPTIONS OF THE DRAWINGS

The accompanying drawings, together with the specification, illustrate exemplary embodiments of the present disclosure, and, together with the description, serve to explain the principles of the present invention.

DETAILED DESCRIPTION

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

An embodiment of the present invention discloses a gate driving circuit. The gate driving circuit comprises a driving unit, a control unit, a first negative voltage input, a driving voltage input, and a control signal input.

Figure 6:
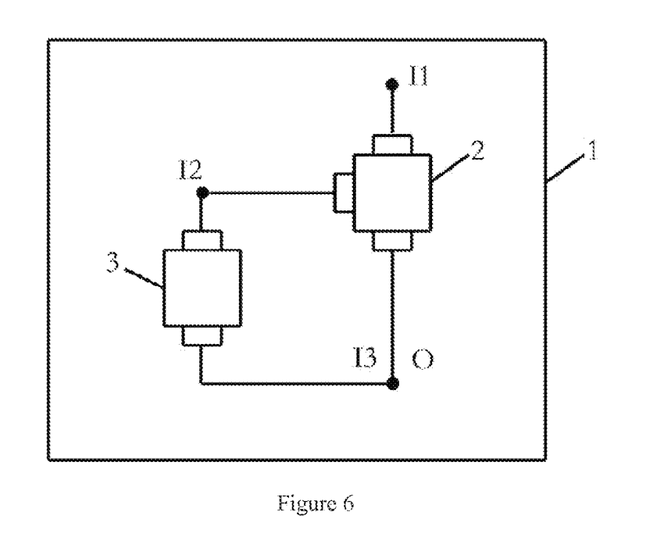
FIG. 6 shows a structure schematic of the driving unit of a gate driving circuit in an embodiment of the present invention.

FIG. 6 shows a structure schematic of the driving unit of a gate driving circuit in an embodiment of the present invention. What should be indicated is that the specific devices shown in the figure just aims at illustrating instead of limiting the technical solutions of the present invention. As shown in FIG. 6, Driving Unit 1 comprises a Driving Element 2 and a Voltage Storage Element 3. Driving Element 2 comprises a control end, a first electrode for inputting driving voltage, and a second electrode for outputting voltage. Driving Element 2 adjusts the output voltage based on the voltage loaded on the control end of Driving Element 2. The first electrode of Driving Element 2 forms a First Input End I1 of Driving Unit 1. One end of Voltage Storage Element 3 connects to the control end of Driving Element 2 in parallel to form a Second Input End I2 of Driving Unit 1. Another end of Voltage Storage Element 3 connects to the second electrode of Driving Element 2 in parallel to form a Third Input End I3 and Output End O of Driving Unit 1. Driving Unit 1 receives external inputs through First Input End I1, Second Input End I2 and Third Input End I3, and outputs gate signals through Output End O, such as outputting gate signals to a pixel driving circuit (not shown in the figure) or to a gate driving circuit in lower level (not shown in the figure). In a specific embodiment, Voltage Storage Element 3 is formed mainly by capacitors. Furthermore, the capacitors may be the ones whose polarities are not distinguished.

With the help of the control unit, Driving Unit 1 works circularly and orderly in first cut-off state, first driving state, second driving state and second cut-off state, in different working states, the connection between an input end of Driving Unit 1 and a driving voltage input, the connection between an input end of Driving Unit 1 and a control signal input, and the connection between an input end of Driving Unit 1 and a first low voltage input, are changed. FIGS. 7 to 10 are structure schematics of Driving Unit 1 in different working states.

Figure 7:
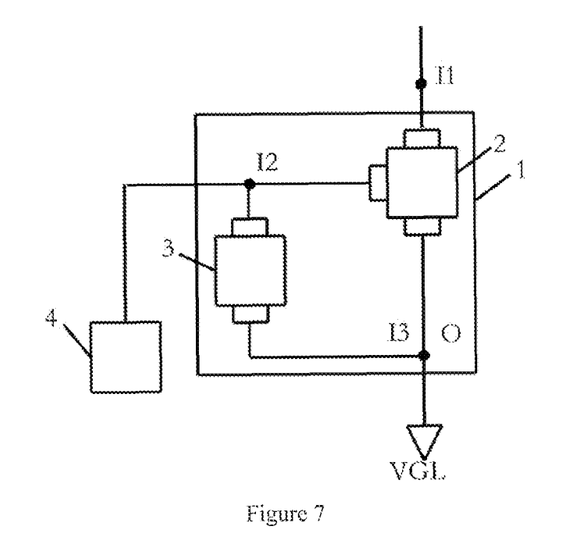
FIG. 7 shows a structure schematic of the driving unit in a first cut-off state in an embodiment of the present invention.

As shown in FIG. 7, when Driving Unit 1 is working in the first cut-off state, though a control unit (not shown in the figure), First Negative Voltage Input VGL is controlled to connect to Third Input End I3 of Driving Unit 1, Control Signal Input Vgn-1 in Driving Unit 1 is controlled to disconnect to Second Input End I2, and Driving Voltage Input VDD is controlled to disconnect to First Input End I1.

Figure 8:
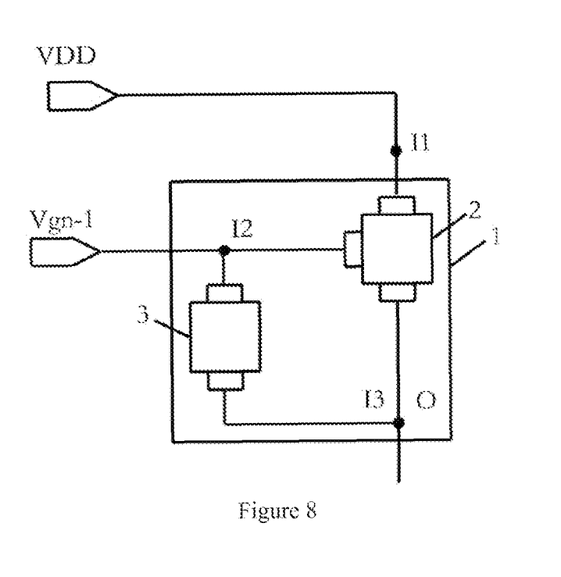
FIG. 8 shows a structure schematic of the driving unit in a first driving state in an embodiment of the present invention.

As shown in FIG. 8, when Driving Unit 1 is working in the first driving state, though a control unit (not shown in the figure), Driving Voltage Input VDD is controlled to connect to First Input End I1, Control Signal Input Vgn-1 is controlled to connect to Second Input End I2, and Third Input End I3 is controlled to disconnect to First Negative Voltage Input VGL.

Figure 9:
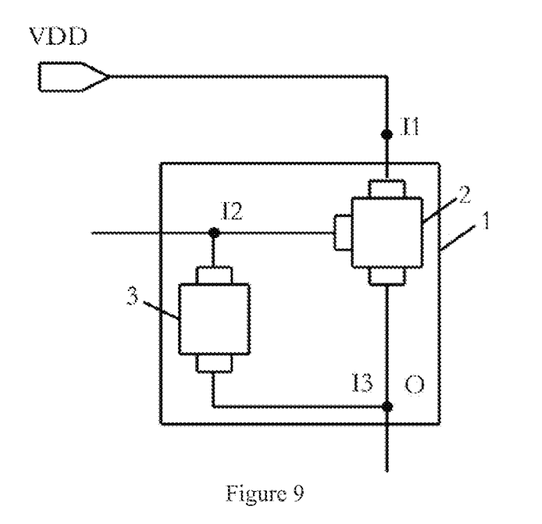
FIG. 9 shows a structure schematic of the driving unit in a second driving state in an embodiment of the present invention.

As shown in FIG. 9, when Driving Unit 1 is working in the second driving state, though a control unit (not shown in the figure), First Input End I1 is controlled to connect to Driving Voltage Input VDD, Control Signal Input Vgn-1 is controlled to disconnect to Second Input End I2, and Third Input End I3 is controlled to disconnect to First Negative Voltage Input VGL.

Figure 10:
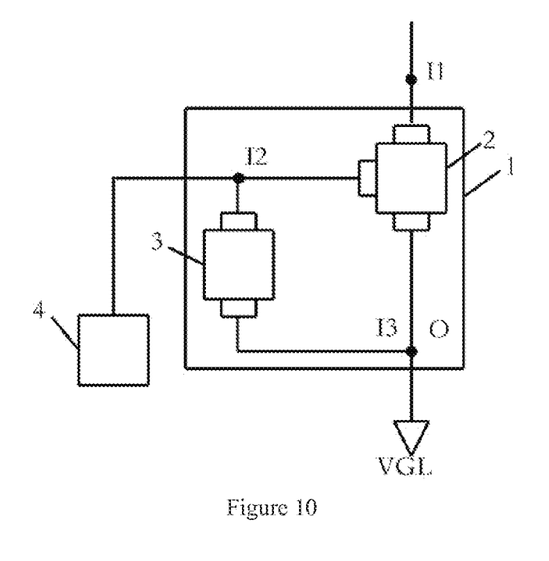
FIG. 10 shows a structure schematic of the driving unit in a second cut-off state in an embodiment of the present invention.

As shown in FIG. 10, when Driving Unit 1 is working in the second cut-off state, though a control unit (not shown in the figure), First Negative Voltage Input VGL is controlled to connect to Third Input End I3, First Input End I1 is controlled to disconnect to Driving Voltage Input VDD, and Second Input End I2 is controlled to disconnect to Control Signal Input Vgn-1.

The gate driving circuit further comprises a First Cut-Off Unit 4 for stopping outputting voltage from Driving Element 2. As shown in FIGS. 7 and 10, when Driving Unit 1 is working in the first cut-off state and the second cut-off state, First Cut-Off Unit 4 is controlled to connect to Second Input End I2 by the control unit (not shown in the figures). Simultaneously, when Driving Unit 1 is working in the first driving state and the second driving state, First Cut-Off Unit 4 is controlled to disconnect to Second Input End I2 by the control unit. Driving Element 2 is closed based on the connection between First Cut-Off Unit 4 and Driving Unit 1, e.g., based on the connection between First Cut-Off Unit 4 and the control end of Driving Element 2. In a specific embodiment of the present invention, Driving Unit 2 is formed mainly by a driving transistor. Further, as the mainly technical filed of the present invention is the gate driving circuits in display panels, preferably, Oxide TFT may be adopted. When Driving Element 2 is an Oxide TFT, preferably, First Cut-Off Unit 4 may formed mainly by a Second Negative Voltage Input, the value of the negative voltage of which may be adjusted based on the Threshold Voltage Vth of the driving transistor of Driving Element 2. In a preferred embodiment, the negative voltage of the second negative voltage input may be set as −10V. To adjust the output of the second negative voltage to adapt to the Oxide TFT with different threshold voltage (Vth) will avoid the situation that drain current which will influence the voltage output of Driving Unit 1 was generated by the voltages loaded on the gate and the source of Driving Element 2 in Oxide TFT are identical.

Based on the above technical solution, the control unit further comprises a first NMOS switching transistor which is connected between First Negative Voltage Input VGL and Third Input End I3. When Driving Unit 1 is working in the first cut-off state and the second cut-off state, the first NMOS switching transistor is conductive, which makes it possible to connect Third Input End I3 of Driving Unit 1 to First Negative Voltage Input VGL; when Driving Unit 1 is working in the first driving unit and the second driving unit, the first NMOS switching transistor is cut-off, which makes it possible to disconnect Third Input End I3 of Driving Unit 1 to First Negative Voltage Input VGL. The use of First Negative Voltage Input VGL is to define the value of the low voltage output by the driving unit. First Negative Voltage Input VGL can be adjusted based on the value of the output low voltage which is required.

Based on the above technical solution, the driving unit further comprises a second NMOS switching transistor which is connected between First Cut-Off Unit 4 and Second Input End I2. When Driving Unit 1 is working in the first cut-off state and the second cut-off state, the second NMOS switching transistor turns on, which makes it possible to connect Second Input End I2 of Driving Unit 1 to First Cut-Off Unit 4; when Driving Unit 1 is working in the first driving state and the second driving unit, the second NMOS switching transistor turns off, which makes it possible to disconnect Second Input End I2 of Driving Unit 1 to First Cut-Off Unit 4.

Based on the above technical solution, as the first NMOS switching transistor and the second NMOS switching transistor are on in the first cut-off state and the second cut-off state, and are off in the first driving state and second driving state, in a preferred embodiment, the first NMOS switching transistor and the second NMOS switching transistor could be connected to the first control level input in the control unit, which reduces the level input of pixel driving circuit panels and is beneficial to simple layouts. The first control level input is connect to the gates of the first NMOS switching transistor and second NMOS switching transistor to control the states of the first NMOS switching transistor and the second NMOS switching transistor. Therefore, the first control level input is positive voltage input during the first cut-off state and the second cut-off state; the first control level input is negative voltage input during the first driving state and the second driving state. Further, the positive voltage input of the first control level input could be 15V, and the negative voltage input of the first control level input could be −15V.

Based on the above technical solution, the control unit comprises a third NMOS switching transistor which is connected between Second Input End I2 and Control Signal Input Vgn−1 to control the conductive/cut-off states of Second Input End I2 and Control Signal Input Vgn−1 in Control Unit 1 during different states. When Control Unit 1 is working in the first cut-off state, the second driving state or the second cut-off state, the third NMOS switching transistor turns off; when Control Unit 1 is working in the first driving state, the third NMOS switching transistor turns on.

Based on the above technical solution, the control unit further comprises a fourth NMOS switching transistor and a second control level input. The fourth NMOS switching transistor is connected between the gate of the third NMOS switching transistor and the Control Signal Input Vgn−1. The second control level input is connected to the gate of the fourth NMOS switching transistor to control the on-off states of the fourth NMOS switching transistor. When Driving Unit 1 is working in the first cut-off state, the second driving state or the second cut-off state, the second control level input inputs negative voltage to cut-off the fourth NMOS switching transistor. Hence, the control signals will not go through the fourth NMOS switching transistor to the gate of the third NMOS switching transistor. When Driving Unit 1 is working in the first driving state, the second control level input inputs positive voltage to make the fourth NMOS switching transistor be conductive. Meanwhile, the Control Signal Input Vgn−1 could go through the fourth NMOS switching transistor to the gate of the third NMOS switching transistor, which makes the third NMOS switching transistor on and makes Control Signal Input Vgn−1 go through the third NMOS switching transistor to make Second Input End I2 of Driving Unit 1 on. In a specific embodiment, the positive voltage input of the second control level input could be 15V, and the negative voltage input of the second control level input could be −15V. With the help of the fourth NMOS switching transistor, the on-off states of the third NMOS switching transistor could be controlled effectively.

Based on the above technical solution, the control unit further comprises a fifth NMOS switching transistor, a control level input and a second cut-off unit. The fifth NMOS switching transistor is connected between the second cut-off unit and the gate of the third NMOS switching transistor. The third control level input is connected to the gate of the fifth NMOS switching transistor. When Driving Unit 1 is working in the second driving state, the third control level input makes the fifth NMOS switching transistor on. When the fifth NMOS switching transistor is conductive, the second cut-off unit is connected to the gate of the third NMOS switching transistor. When Driving Unit 1 is working in the first cut-off state, the first driving state or the second cut-off state, the third control level makes the fifth NMOS switching transistor on, and makes the second cut-off unit disconnect the gate of the third NMOS switching transistor. With the help of the second cut-off unit and the controlling method thereof using fifth NMOS switching transistor can realize the entirely close of the third NMOS switching transistor while in the cut-off state, which avoids the circuit malfunction problem caused by drain current. In a preferred embodiment, a third negative voltage input can be applied to the second cut-off unit. The third negative voltage input can be adjusted to adapt the third NMOS switching transistors with different threshold voltage (Vth). Preferably, the third negative voltage input could be −12V. In another embodiment, the positive voltage of the above third control level input could be 15V, and the negative voltage of the above third control level input could be −15V.

In the embodiments of the present invention, there also comprises a display panel which uses the above gate driving circuit. There is a plurality of gate driving circuits which constitute a driving circuit wherein the output of each level of the gate driving circuits acts as the control signal input of next level of the gate driving circuits.

Figure 11:
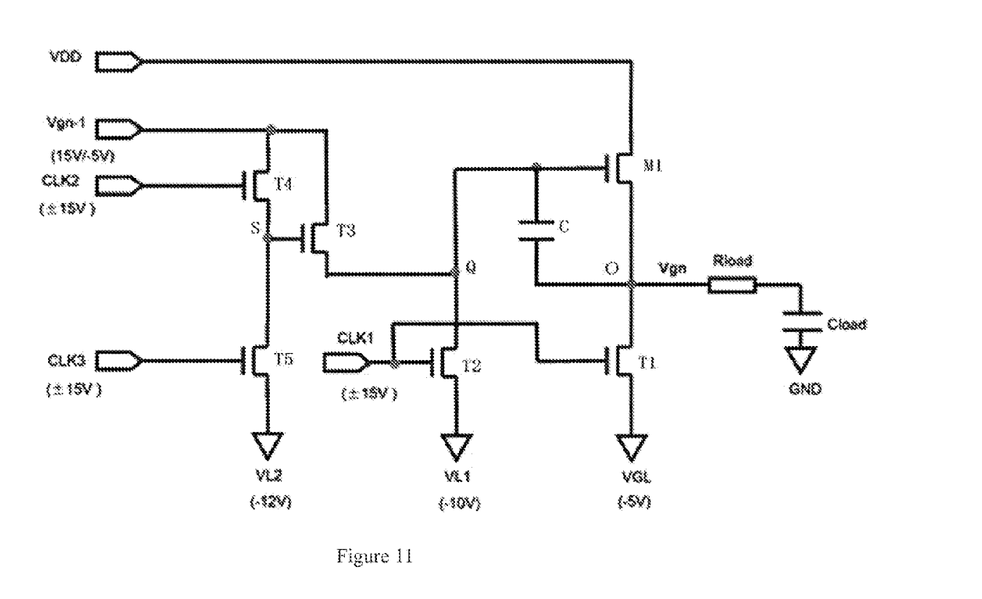
FIG. 11 shows a structure schematic of the gate circuit in an embodiment of the present invention.
Figure 12:
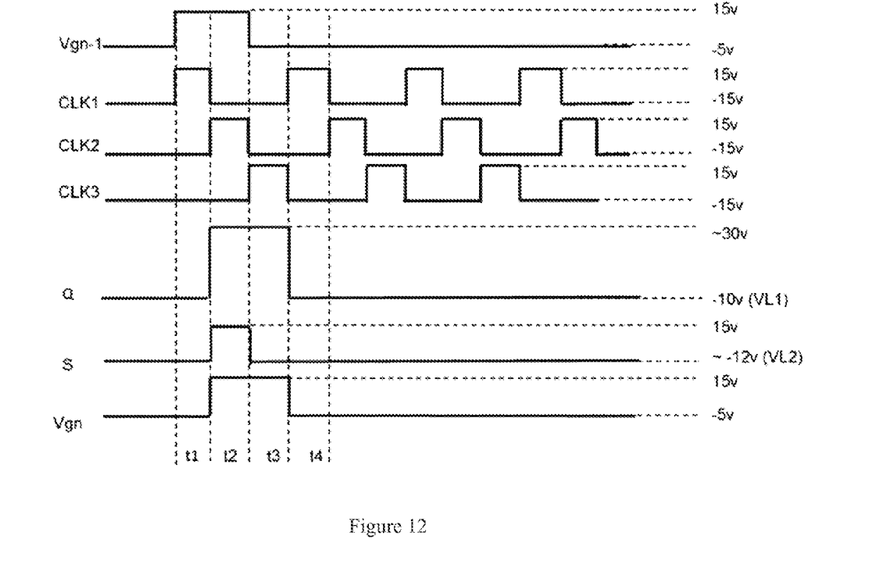
FIG. 12 is a sequence chart of the circuit shown in FIG. 11.

FIG. 11 shows a structure schematic of the gate driving circuit in an embodiment of the present invention. What should be indicated is that the specific devices shown in the figure just aims at illustrating instead of limiting the technical solutions of the present invention. In practical applications, integrated gate driving circuit comprises a plurality of gate driving circuit disclosed in the present invention, to indicate the technical solution simply, FIG. 11 only shows the structure schematic of one level of the gate driving circuits. Rload and Cload in FIG. 11 respectively denote the loads of the gate scanning circuit. Referring to FIGS. 11 and 12, the circuit comprises a Driving Transistor M1 and a Capacitor C which form the above driving unit, a First NMOS Switching Transistor T1 which forms the above control unit, a Second NMOS Switching Transistor T2, a Third NMOS Switching Transistor T3, a Fourth NMOS Switching Transistor T4, a Fifth NMOS Switching Transistor T5, a Driving Voltage Input VDD, a Control Signal Input Vgn−1, a First Negative Voltage Input VGL (−5V), a Second Negative Voltage Input VL1 (10V) which forms the first cut-off unit, a Third Negative Voltage Input VL2 (−12V) which forms the second cut-off unit, a Second Control Level Input CLK2 (±15V), and a Third Control Level Input CLK3 (±15V). The connections among the above elements are shown in FIG. 11.

When the driving unit is working in the first cut-off state, the positive voltage which is 15V is loaded on the gate of Second NMOS Switching Transistor T2 by First Control Level Input CLK1, which makes Second NMOS Switching Transistor T2 be conductive. Therefore, voltage (−10V) is loaded on the gate of Driving Transistor M1 by Second Negative Voltage Input VL1, i.e., the value of the voltage on Point Q is −10V, which makes the Driving Transistor M1 off and makes Driving Voltage Input VDD not go through Driving Transistor M1. Meanwhile, positive voltage (15V) is loaded on the gate of First NMOS Switching Transistor T1 by First Control Level Input CLK1, which makes First NMOS Switching Transistor T1 be conductive. Therefore, First Negative Voltage Input VGL is connected to Point O of the driving unit, which makes Output Voltage Vgn be −5V when the driving unit is working in the first cut-off state.

When the driving unit is working in the first driving state, Second Control Level Input CLK2 output high voltage to Fourth NMOS Switching Transistor T4, which makes Control Signal Input Vgn−1 connect to the gate of Third NMOS Switching Transistor T3 in Point S with the help of Fourth NMOS Switching Transistor T4. In the meantime, the voltage Vs loaded on Point S equals to Vgn−1 whose value is 15V, i.e., Vs=Vgn−1=15V. Hence, Third NMOS Switching Transistor T3 is conductive, which makes Control Signal Input Vgn−1 connect to Point Q with the help of Third NMOS Switching Transistor T3, and then the voltage $V_Q$ loaded on Point Q equals to Vgn−1 whose value is 15V, i.e., $V_Q$=Vgn−1=15V, in the meantime, Driving Transistor M1 is conductive. As Driving Transistor M1 becomes conductive during the time when the driving unit is working in an initial phase of the first driving state, the initial voltages loaded on the both sides of Capacitor C shown as $V_Q$ and Vgn are 15V and 0V respectively, i.e., the voltage difference between the two ends of Capacitor C is 15V, which makes it possible to charge Capacitor C. In the meantime, as Driving Transistor M1 is conductive, the value of the Vgn increases little by little. Voltage bootstrap occurs to maintain the voltage difference (15V) between the two ends of Capacitor C, that is, with the increase of the value of Vgn, the value of $V_Q$ on the other end of the capacitor will rise accordingly, which makes the voltage difference between the two ends of Capacitor C always be 15V. With the increase of the value of $V_Q$, Driving Transistor will turn on more swiftly, which will boost the more rapid increase of Output Voltage Vgn on Point O in the driving unit. When Driving Transistor M1 is conductive completely, the value of Vgn is increased to the value of Driving Voltage Input VDD which is 15V. In the meantime, with the help of the voltage bootstrap of Capacitor C, the voltage of $V_Q$ is about 30V.

When the driving unit is working in the second driving state, First Control Level Input CLK1 and Second Control Level Input CLK2 both are negative voltage inputs which are −15V, Third Control Level Input CLK3 is positive voltage input which is 15V. Hence, Third Negative Voltage Input VL2 go through the fifth NMOS switching transistor, and the voltage loaded on Point S becomes −12V, which promotes the rapid cut-off of the Third NMOS Switching Transistor T3, and Control Signal Input Vgn−1 can not go through Third NMOS Switching Transistor T3. There is a voltage difference between the two ends of Capacitor C which charges Capacitor C when the driving unit is working in the first driving state. Therefore, when the driving unit is working in the second driving state, Capacitor C discharges to maintain the high voltage on Point Q, which makes Driving Transistor M1 works in the conductive state and makes Driving Voltage Input VDD go through Driving Transistor M1 continuously. Hence, the Output Voltage Vgn at Point O in the driving unit can be hold to 15V.

When the driving unit is working in the second cut-off state, First Control Level Input CLK1 becomes positive voltage input which is 15V, in the meantime, Second Control Level Input CLK2 and Third Control Level Input CLK3 is negative voltage input which is −15V. As Second NMOS Switching Transistor T2 is conductive, Second Negative Voltage Input VL1 is input to the gate of Driving Transistor M1, Driving Transistor M1 will turn off rapidly, the Output Voltage Vgn of Output End O in the driving unit decreases rapidly to −5V which equals to First Negative Voltage Input VGL.

Figure 13:
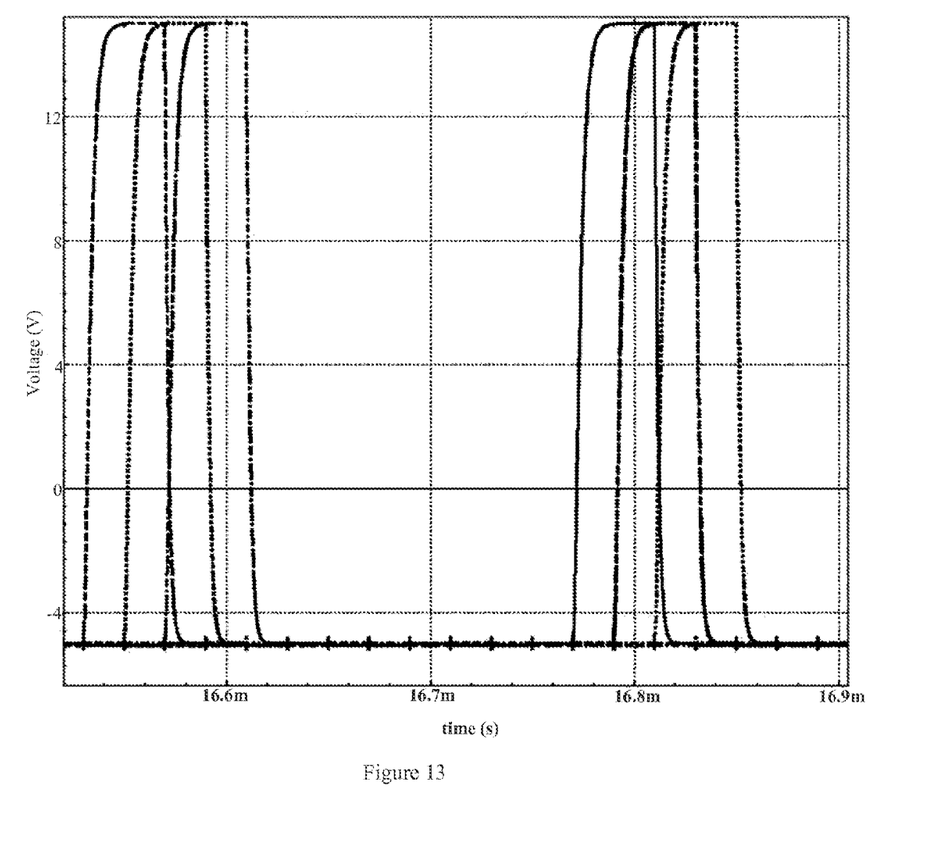
FIG. 13 is a test chart of the gate driving waveform based on the gate driving circuit shown in FIG. 11.

FIG. 13 is a test chart of the gate driving waveform based on the gate driving circuit shown in FIG. 11. The X direction indicates test time, and the Y direction indicates the gate signal voltage input from gate driving circuit. As shown in the figure, each squiggle indicates an output of a level of the gate driving circuit. The adjacent three squiggles indicate the output from the pre-level of the gate driving circuits, the output from the present level of the gate driving circuits and the output from the next level of the gate driving circuits respectively. There is a time difference between the two adjacent squiggles of the three, which is in correspondence with Vgn−1 and Vgn shown in FIG. 12. To illustrate simply, FIG. 13 just shows the waveforms of the driving outputs from the initial three levels and the last three levels of the gate driving circuits in the driving circuit integrated by gate driving circuits with multiple levels. It is understandable that there are other waveforms of the driving outputs between the initial three levels and the last three levels. As shown in FIG. 13, the gate signal can be pulled up to the required gate output signal and can be pulled down to the required low level state. Hence, the gate driving circuit discloses in the embodiment of the present invention can output ideal gate driving waveform, which avoids the circuit malfunction caused by the drain current possibly existed in the driving unit.

The gate driving circuit and display panel disclosed in the present invention will not generate drain current on Oxide TFT working in exhausting modal so that the circuit malfunction will not occur. In the meantime, the structure of the gate driving circuit disclosed in the embodiments according to the present invention is simple so that the area on the display panel occupied by the circuit is small, which will be beneficial for controlling the panel to make it possible to form a narrow frame. Moreover, the gate driving circuit can adjust the voltage input according to the threshold voltage of the TFT transistors, which enlarges the scope of the present invention.

While the present disclosure has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A gate driving circuit comprising:
   a control unit controlling the driving circuit to work orderly and recurrently in a first cut-off state, a first driving state, a second driving state and a second cut-off state;
   wherein the gate driving circuit further comprises:
   a driving unit for driving the gate driving circuit;
   a first negative voltage input for defining the voltages output from the driving unit;
   a driving voltage input providing voltages to the driving unit; and
   a control signal input for switching on the driving unit; wherein,
   when the driving unit works in the first cut-off state, the control unit controls the first negative voltage input to connect to the driving unit;
   when the driving unit works in the first driving state, the control unit controls the driving voltage input and the control signal input to connect to the driving unit respectively; and the control unit controls the first negative voltage input to disconnect to the driving unit;
   when the driving unit works in the second driving state, the control unit controls the driving voltage input to connect to the driving unit; and the control unit controls the control signal input disconnect to the driving unit;
   when the driving unit works in the second cut-off state, the control unit controls the first negative voltage input to connected to the driving unit; and the control unit controls the driving voltage input to disconnect to the driving unit.

2. The gate driving circuit as claimed in claim 1, wherein the driving unit comprises a driving element and a voltage storage element;
   the driving element comprises a control end, a first electrode for inputting driving voltage and a second electrode for outputting voltages; the voltages outputted from the driving element are adjusted according to voltage change on the control end.

3. The gate driving circuit as claimed in claim 2, wherein the first electrode is a first input end of the driving unit;
   a node connecting one end of the voltage storage element with the control end in parallel is a second input end of the driving unit;
   a node connecting the other end of the voltage storage element with the second electrode in parallel is a third input end as well as a output end of the driving unit.

4. The gate driving circuit as claimed in claim 3, wherein the gate driving circuit further comprises a first cut-off unit stopping the driving element outputting voltages;
   when the driving unit works in the first cut-off state or the second cut-off state, the first cut-off unit is controlled by the control unit to connect to the second input end;
   when the driving unit works in the first driving state or the second driving state, the first cut-off unit is controlled by the control unit to disconnect to the second input end.

5. The gate driving circuit as claimed in claim 4, wherein the control unit comprises:
   an NMOS switching transistor connected between the first negative voltage input and the third input end;
   when the driving unit works in the first cut-off state or the second cut-off state, the first NMOS switching transistor turns on;
   when the driving unit works in the first driving state or the second driving state, the first NMOS switching transistor turns off.

6. The gate driving circuit as claimed in claim 5, wherein the control unit comprises:
   a second NMOS switching transistor connected between the first cut-off unit and the second input end;
   when the driving unit works in the first cut-off state or the second cut-off state, the second NMOS switching transistor turns on;
   when the driving unit works in the first driving state or the second driving state, the second NMOS switching transistor turns off;
   the first NMOS switching transistor and the second NMOS switching transistor are connected to a first control level input; the on-off state of the first NMOS switching transistor is identical to that of the second NMOS switching transistor.

7. The gate driving circuit as claimed in claim 4, wherein the control unit comprises:
   a second NMOS switching transistor connected between the first cut-off unit and the second input end;
   when the driving unit works in the first cut-off state or the second cut-off state, the second NMOS switching transistor turns on;
   when the driving unit works in the first driving state or the second driving state, the second NMOS switching transistor turns off.

8. The gate driving circuit as claimed in claim 4, wherein the control unit comprises a third NMOS switching transistor connected between the second input end and the control signal input;
   when the driving unit works in the first cut-off state, the second driving state or the second cut-off state, the third NMOS switching transistor turns off;
   when the driving unit works in the first driving state, the third NMOS switching transistor turns on.

9. The gate driving circuit as claimed in claim 8, wherein the control unit further comprises:
   a fourth NMOS switching transistor connected between the control signal input and the gate of the third NMOS switching transistor; and
   a second control level input connected to the gate of the fourth NMOS switching transistor;
   when the driving unit works in the first cut-off state or the second cut-off state, the second control level input controls the fourth NMOS switching transistor to turn off;
   when the driving unit works in the first driving state, the second control level input controls the fourth NMOS switching transistor to turn on.

10. The gate driving circuit as claimed in claim 9, wherein the control unit further comprises:
    a fifth NMOS switching transistor, a third control level input, and a second cut-off unit;

the fifth NMOS switching transistor is connected between the second cut-off unit and the control end of the third NMOS switching transistor; and the third level input is connected to the control end of the fifth NMOS switching transistor;

when the driving unit works in the second driving state, the third control level input controls the fifth NMOS switching transistor to turn on;

when the driving unit works in the first cut-off state, the first driving state or the second cut-off state, the third control level input controls the fifth NMOS switching transistor to turn off.

11. The gate driving circuit as claimed in claim 10, wherein the second cut-off unit is formed by a third negative voltage input.

12. The gate driving circuit as claimed in claim 11, wherein voltage input from the third negative voltage input is −12V.

13. The gate driving circuit as claimed in claim 4, wherein the first cut-off unit is formed by a second negative voltage input.

14. The gate driving circuit as claimed in claim 13, wherein voltage input from the second negative voltage input is −10V.

15. The gate driving circuit as claimed in claim 4, wherein the voltage storage element is formed by a capacitor.

16. The gate driving circuit as claimed in claim 4, wherein voltage input from the first negative voltage input is −5V.

* * * * *